(12) United States Patent  
Hayasaka

(10) Patent No.: US 9,136,833 B2
(45) Date of Patent: Sep. 15, 2015

(54) POWER SOURCE CONNECTION CIRCUIT

(71) Applicant: Asahi Kasei Microdevices Corporation, Tokyo (JP)

(72) Inventor: Naoto Hayasaka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/376,172

(22) PCT Filed: Feb. 22, 2013

(86) PCT No.: PCT/JP2013/001007
§ 371 (c)(1),
(2) Date: Aug. 1, 2014

(87) PCT Pub. No.: WO2013/128859
PCT Pub. Date: Sep. 6, 2013

(65) Prior Publication Data
US 2014/0368255 A1 Dec. 18, 2014

(30) Foreign Application Priority Data
Mar. 1, 2012 (JP) .................. 2012-045624

(51) Int. Cl.
*H03K 17/687* (2006.01)
*H03K 17/08* (2006.01)
(Continued)

(52) U.S. Cl.
CPC .............. *H03K 17/08* (2013.01); *H03K 17/063* (2013.01); *H03K 17/08104* (2013.01); *H03K 17/687* (2013.01); *H03K 2217/0036* (2013.01); *H03K 2217/0054* (2013.01)

(58) Field of Classification Search
None
See application file for complete search history.

(56) References Cited

U.S. PATENT DOCUMENTS 5,322,803 A * 6/1994 Cappelletti et al. ........... 438/237
5,361,008 A   11/1994 Saijo
(Continued)

FOREIGN PATENT DOCUMENTS

JP  H06-244693 A  9/1994
JP  2002-076865 A  3/2002
(Continued)

OTHER PUBLICATIONS

International Search Report issued in corresponding International Patent Application No. PCT/JP2013/001007 dated Mar. 26, 2013.

*Primary Examiner* — Cassandra Cox
(74) *Attorney, Agent, or Firm* — Morgan, Lewis & Bockius LLP

(57) ABSTRACT

There is provided a power source connection circuit, when a switch having a low dielectric strength is employed, capable of preventing excessive power consumption when the switch between an input terminal and an output terminal is turned off, and also discharging electric charges accumulated in a gate of the switch. A power source connection circuit includes a MOS switch connected to an output terminal; a step-up circuit for supplying electric charges to a gate of the MOS switch; an electric-charge discharging unit coupled between the gate and a ground terminal; and a comparator for comparing a voltage of the output terminal with a reference voltage, wherein the electric-charge discharging unit includes a rectifier unit coupled between the gate and the ground terminal, and a switch coupled in series with the rectifier unit between the gate and the ground terminal to receive an output signal of the comparator at a gate.

22 Claims, 12 Drawing Sheets

(51) Int. Cl.
*H03K 17/06* (2006.01)
*H03K 17/081* (2006.01)

(56) References Cited

U.S. PATENT DOCUMENTS

| | | |
|---|---|---|
| 2006/0038584 A1 | 2/2006 | Mitsuda |
| 2007/0008672 A1 | 1/2007 | Ohshima |
| 2009/0268492 A1 * | 10/2009 | Omi .............................. 363/84 |
| 2010/0155962 A1 * | 6/2010 | Inoue et al. .................. 257/774 |

FOREIGN PATENT DOCUMENTS

| | | |
|---|---|---|
| JP | 2004-173292 A | 6/2004 |
| JP | 2006-086507 A | 3/2006 |
| JP | 2007-017262 A | 1/2007 |

* cited by examiner

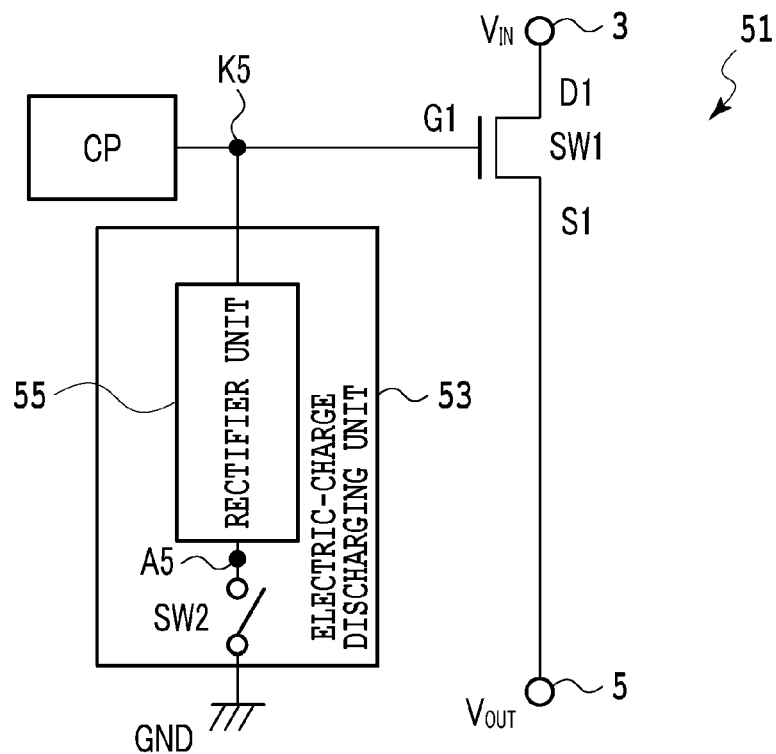
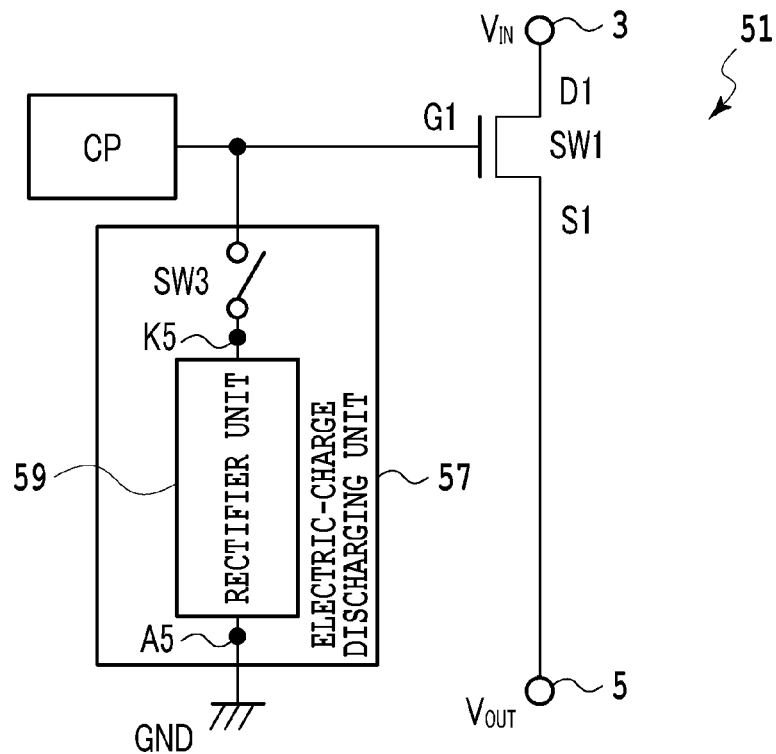

POWER SOURCE CONNECTION CIRCUIT

TECHNICAL FIELD

The present invention relates to a power source connection circuit, and more particularly to a power source connection circuit including a Zener diode and capable of discharging electric charges accumulated in a gate of a switch.

BACKGROUND ART

Nowadays, our living environment includes various kinds of electronic devices, such as a personal computer, a DVD player, and a video camera. Some of the electronic devices are connected to a power supply such as a battery or a wall outlet to operate, using a connection device such as a USB device. The connection device used in this case has a power source connection circuit for connecting an electronic device with a power supply.

The power source connection circuit is provided with a switch between an input terminal to which a power supply is connected and an output terminal to which an electronic device is connected, so that when an input voltage is an overvoltage or when a current passing through the switch is an overcurrent, the switch is turned off to prevent the overvoltage or the overcurrent from being transmitted to the output terminal.

In addition, since the switch may be destroyed when dirt or the like between the output terminal and the ground causes a short circuit and a gate-source voltage of the switch becomes an overvoltage, the power source connection circuit needs to discharge electric charges accumulated in the gate of the switch.

FIG. 1 is a circuit diagram of a conventional power source connection circuit 1. The power source connection circuit 1 includes an input terminal 3 which is connected to a power supply, an output terminal 5 which is connected to an electronic device, and a switch SW1 having its ends connected to the input terminal 3 and the output terminal 5. A drain D1 of the switch SW1 is connected to the input terminal 3, and a source S1 of the switch SW1 is connected to the output terminal 5. A gate G1 of the switch SW1 is connected to a step-up circuit CP for supplying electric charges to the switch SW1. Further, between the gate G1 of the switch SW1 and the source S1 of the switch SW1 is connected a Zener diode T1 for discharging electric charges accumulated in the gate G1. More specifically, the gate G1 of the switch SW1 is connected to a cathode K1 of the Zener diode T1, and an anode A1 of the Zener diode T1 is connected to the source S1 of the switch SW1.

A description will be given of the operation of the power source connection circuit 1. First, the step-up circuit CP supplies electric charges to the gate G1 of the switch SW1 and increases the gate voltage of the switch SW1 to turn on the switch SW1. Then, through the switch SW1, an input voltage $V_{IN}$ from the input terminal 3 is outputted from the output terminal 5 to an electronic device as an output voltage $V_{OUT}$. When the output terminal 5 is short-circuited to the ground and a gate-source voltage $V_{GS}$ of the switch SW1 exceeds a breakdown voltage $V_D$ of the Zener diode T1, the Zener diode T1 is turned on to discharge the electric charges accumulated in the gate G1. A power source connection circuit having the same feature as the power source connection circuit 1 is disclosed, for example, in PTL 1.

FIG. 2 is a circuit diagram of another conventional power source connection circuit 21. The power source connection circuit 21 is different from the power source connection circuit 1 in that Zener diodes T1 and T2 are connected in series in opposite directions to each other between a gate and a source of a switch SW1. More specifically, a source S1 of the switch SW1 is connected to an anode A1 of the Zener diode T1, a cathode K1 of the Zener diode T1 is connected to a cathode K2 of the Zener diode T2, and an anode A2 of the Zener diode T2 is connected to a gate G1 of the switch SW1.

A description will be given of the operation of the power source connection circuit 21. First, a step-up circuit CP supplies electric charges to the gate G1 of the switch SW1 and increases a gate voltage of the switch SW1 to turn on the switch SW1. Then, through the switch SW1, an input voltage $V_{IN}$ from an input terminal 3 is outputted from an output terminal 5 to an electronic device as an output voltage $V_{OUT}$. When the output terminal 5 is short-circuited to the ground and a gate-source voltage $V_{GS}$ of the switch SW1 exceeds a total voltage of a breakdown voltage $V_D$ of the Zener diode T1 and a threshold voltage Vf (a forward voltage Vf) of the Zener diode T2, the Zener diodes T1 and T2 are turned on to discharge the electric charges accumulated in the gate G1. A power source connection circuit having the same feature as the power source connection circuit 21 is disclosed, for example, in PTL 2.

CITATION LIST

Patent Literature

PTL 1: Japanese Patent Laid-open No. 2002-76865
PTL 2: Japanese Patent Laid-open No. 2004-173292

SUMMARY OF INVENTION

Technical Problem

The power source connection circuit 1 of FIG. 1 can discharge electric charges accumulated in the gate G1 when a maximum gate-source voltage $V_{GS}MAX$ allowed by the switch SW1 is higher than a breakdown voltage $V_D$. However, if the switch SW1 is turned off during normal operation in which an output voltage $V_{OUT}$ is not short-circuited, a gate voltage becomes a ground voltage. Accordingly, a current flows from the output terminal 5 to which an output capacitor for stabilizing power from an electronic device is connected, through the Zener diode T1, to the gate G1, causing the problem of excessive power consumption.

In the power source connection circuit 21 of FIG. 2, while the switch SW1 is off, a current does not flow from the output terminal 5 to the gate G1. However, the power source connection circuit 21 can discharge electric charges accumulated in the gate G1 only when a maximum gate-source voltage $V_{GS}MAX$ is higher than a total voltage of a breakdown voltage $V_D$ of the Zener diode T1 and a threshold voltage Vf of the Zener diode T2. Therefore, there is a problem that the switch SW1 having a low dielectric strength cannot be employed.

The present invention has been made to solve the above problems, and it is an object of the present invention to provide a power source connection circuit, even when a switch having a low dielectric strength is employed, capable of preventing excessive power consumption when the switch between an input terminal and an output terminal is turned off, and also discharging electric charges accumulated in a gate of the switch.

Solution to Problem

To achieve this object, the present invention provides a power source connection circuit including: a MOS switch having a drain connected to an input terminal and a source connected to an output terminal; a step-up circuit for supplying electric charges to a gate of the MOS switch; an electric-charge discharging unit coupled between the gate and a ground terminal; and a comparator for comparing a voltage of the output terminal with a reference voltage, wherein the electric-charge discharging unit includes a rectifier unit coupled between the gate and the ground terminal, and a switch coupled in series with the rectifier unit between the gate and the ground terminal to receive an output signal of the comparator at a control terminal of the switch.

Another embodiment of the present invention provides a power source connection circuit including: a MOS switch having a drain connected to an input terminal and a source connected to an output terminal; a step-up circuit for supplying electric charges to a gate of the MOS switch; an electric-charge discharging unit coupled between the gate and a ground terminal; and a comparator for comparing a voltage of the output terminal with a reference voltage, wherein the electric-charge discharging unit includes a switch coupled between the gate and the ground terminal, and a clock signal providing unit for providing a clock signal to a control terminal of the switch according to an output signal of the comparator.

Advantageous Effects of Invention

As described above, according to the power source connection circuit of the present invention, even when a switch having a low dielectric strength is employed, it is possible to prevent excessive power consumption when the switch between an input terminal and an output terminal is turned off, and also to discharge electric charges accumulated in a gate of the switch.

BRIEF DESCRIPTION OF DRAWINGS

FIG. 5A is a conceptual diagram of a more detailed power source connection circuit of the present invention;

FIG. 5B is a conceptual diagram of a more detailed power source connection circuit of the present invention;

DESCRIPTION OF EMBODIMENTS

Hereinafter, embodiments of the present invention will be described in detail with reference to the drawings. The power source connection circuit of the present invention can be used for a connection device, such as a USB device, for connecting an electronic device with a power supply.

(Concept)

Figure 1:
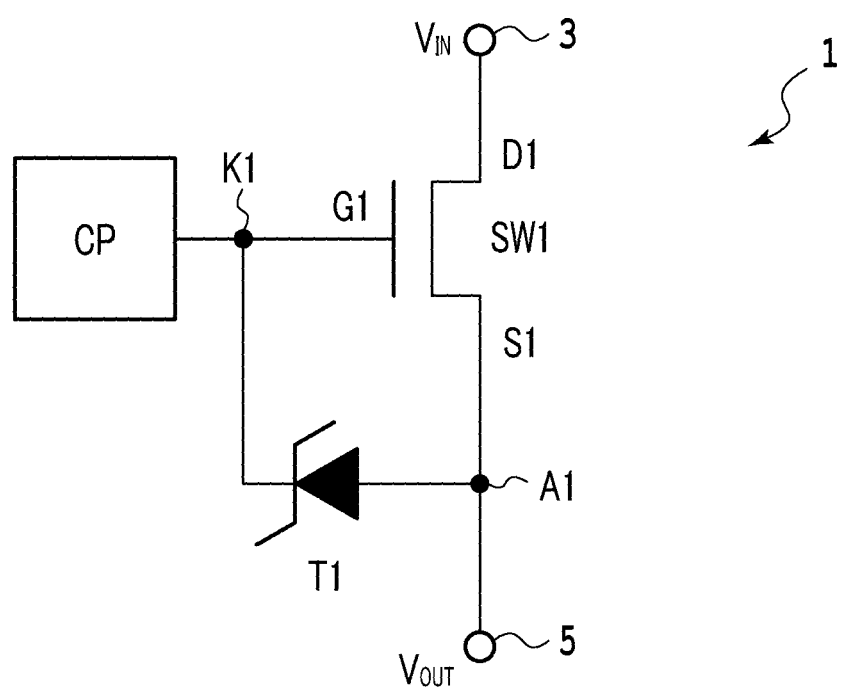
FIG. 1 is a circuit diagram of a conventional power source connection circuit.
Figure 2:
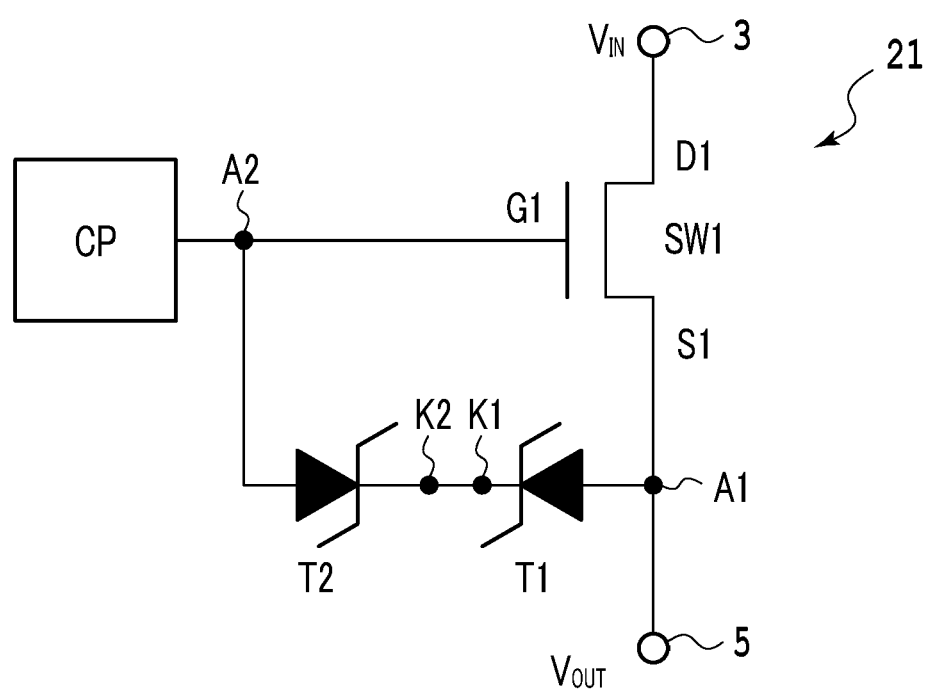
FIG. 2 is a circuit diagram of another conventional power source connection circuit.
Figure 3:
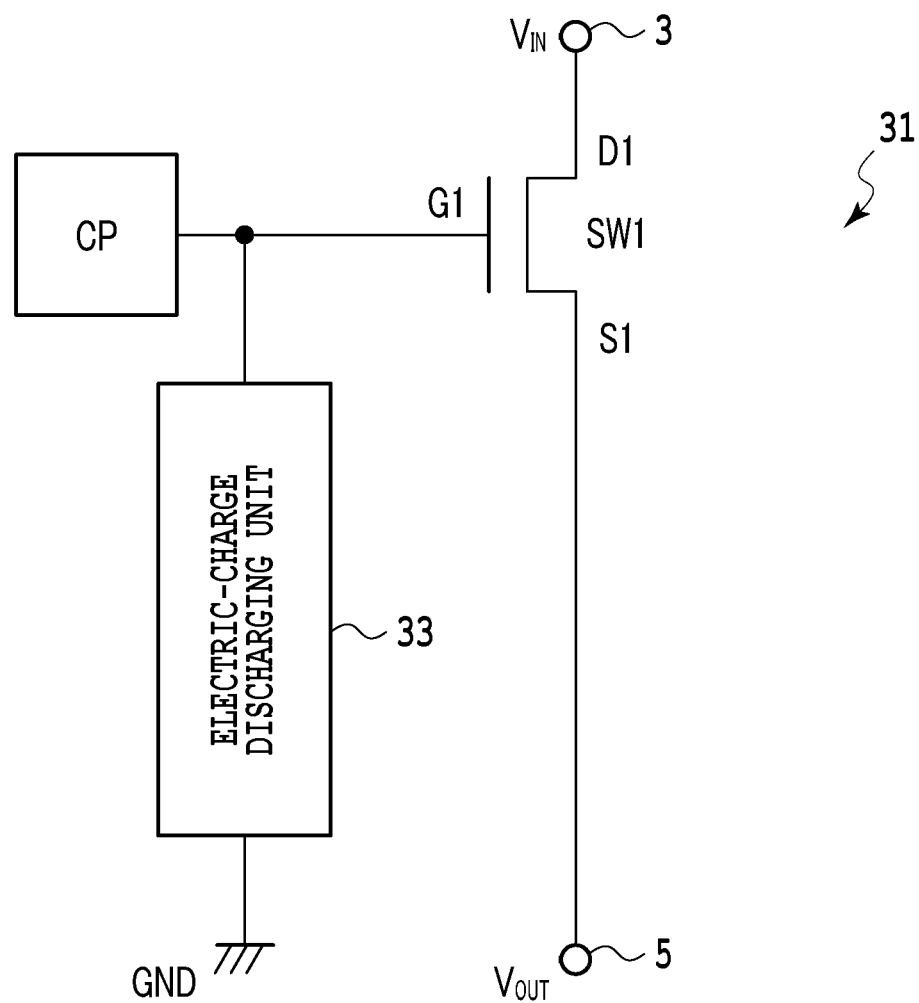
FIG. 3 is a conceptual diagram of a power source connection circuit of the present invention.

FIG. 3 is a conceptual diagram of a power source connection circuit 31 of the present invention. In FIG. 3, the power source connection circuit 31 includes a MOS switch SW1 for receiving an input voltage $V_{IN}$ from an input terminal 3 (a first terminal) and outputting an output voltage $V_{OUT}$ to an output terminal 5 (a second terminal), a step-up circuit CP for supplying electric charges to a gate of the MOS switch SW1, and an electric-charge discharging unit 33 for forming a current path from a gate G1 to a ground terminal GND (a third terminal) which is different from the output terminal 5 to discharge the electric charges accumulated in the gate G1 to the ground terminal GND when the output voltage $V_{OUT}$ is lower than a reference voltage, and interrupting the current path when the output voltage $V_{OUT}$ is higher than the reference voltage. The MOS switch SW1 includes an N-channel MOS transistor.

In the power source connection circuit 31, the step-up circuit CP supplies electric charges to the gate G1 of the MOS switch SW1 and increases a gate voltage to turn on the MOS switch SW1. Once the MOS switch SW1 is turned on, an input voltage $V_{IN}$ is transmitted from the input terminal 3 to the output terminal 5 as an output voltage $V_{OUT}$. When the output terminal 5 is not short-circuited, the output voltage $V_{OUT}$ is higher than a reference voltage. Since the output voltage $V_{OUT}$ is higher than a reference voltage, a current path from the gate G1 to the ground terminal GND is not formed. The reference voltage as used herein means a voltage indicating that the output terminal 5 is short-circuited to the ground. The ground terminal is a terminal different from the output terminal 5 and having a voltage capable of discharging electric charges accumulated in the gate G1. More specifically, the ground terminal includes, for example, an earth terminal, an analog ground terminal having a voltage generated by dividing a power supply voltage, and a terminal having a voltage generated by a reference voltage generation circuit such as a band gap circuit.

The electric-charge discharging unit 33 is coupled between the ground terminal GND which is different from the output terminal 5 and the gate G1, and a current path does not exist between the output terminal 5 and the gate G1.

Therefore, even if the MOS switch SW1 is turned off during normal operation in which the output terminal 5 is not short-circuited to the ground (when a short is removed), the power source connection circuit 31 can prevent a current from flowing from the output terminal 5 to the gate G1 of the MOS switch SW1. Thereby, excessive power consumption can be avoided.

Next, while the MOS switch SW1 is on by the step-up circuit CP, once the output terminal 5 is short-circuited, the output voltage $V_{OUT}$ falls below the reference voltage.

Once the output terminal 5 is short-circuited, the electric-charge discharging unit 33 forms a current path from the gate G1 to the ground terminal GND which is different from the output terminal 5 to discharge the electric charges accumulated in the gate G1 to the ground terminal GND. Then, when the short circuit of the output terminal 5 is removed, the current path is interrupted. The interruption of the current path allows electric charges to be accumulated again in the gate G1. If the short circuit of the output terminal 5 is removed, an input voltage $V_{IN}$ is transmitted from the input terminal 3 to the output terminal 5 as an output voltage $V_{OUT}$, and the output voltage $V_{OUT}$ exceeds the reference voltage. If the output terminal 5 remains short-circuited, the electric-charge discharging unit 33 forms a current path from the gate G1 to the ground terminal GND which is different from the output terminal 5 to discharge the electric charges accumulated in the gate G1 to the ground terminal GND.

In this manner, since the power source connection circuit 31 is configured to form a current path from the gate G1 to the ground terminal GND which is different from the output terminal 5 while the output terminal 5 is short-circuited, even when a switch having a low dielectric strength is employed, it is possible to discharge the electric charges accumulated in the gate of the switch. In other words, the power source connection circuit 31 allows a switch to have a lower dielectric strength, and there is no need to employ a switch having a high dielectric strength.

As described above, the power source connection circuit 31 of the present invention has the aforementioned structure and operation, and therefore, even when the switch SW1 having a low dielectric strength is employed, it is possible to prevent excessive power consumption when the switch SW1 between the input terminal 3 and the output terminal 5 is turned off, and also to discharge the electric charges accumulated in the gate G1 of the switch SW1.

Figure 4:
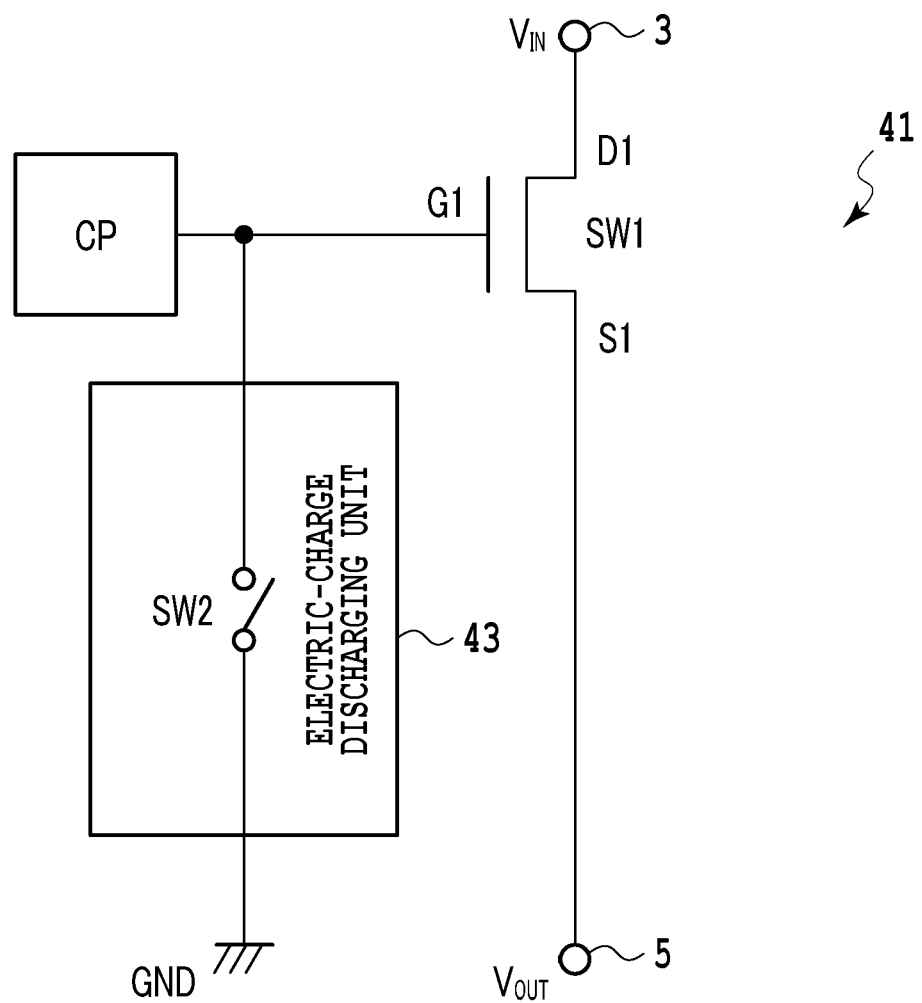
FIG. 4 is a conceptual diagram of a more detailed power source connection circuit of the present invention.

FIG. 4 is a conceptual diagram of a more detailed power source connection circuit of the present invention.

In a power source connection circuit 41, an electric-charge discharging unit 43 is configured to have a switch unit SW2 for forming a current path from the gate G1 to the ground terminal GND when an output voltage $V_{OUT}$ is lower than a reference voltage, and interrupting the current path when the output voltage $V_{OUT}$ is higher than the reference voltage. One terminal of the switch unit SW2 is connected to the gate G1 and the other terminal of the switch unit SW2 is connected to the ground terminal.

While the output terminal 5 is short-circuited, that is, when an output voltage $V_{OUT}$ falls below a reference voltage, the switch unit SW2 is turned on to form a current path between the gate G1 and the ground terminal GND. Then, the electric charges accumulated in the gate G1 are discharged to the ground. While the output terminal 5 is not short-circuited, that is, when the output voltage $V_{OUT}$ exceeds the reference voltage, the switch unit SW2 is turned off to cut off the connection between the gate G1 and the ground terminal GND. That is, the switch unit SW2 is turned off to interrupt the current path. Then, the step-up circuit CP again supplies electric charges to the gate G1 of the MOS switch SW1.

In this manner, since the power source connection circuit 41 is configured to form a current path from the gate G1 to the ground terminal GND while the output terminal 5 is short-circuited, that is, when an output voltage $V_{OUT}$ is lower than a reference voltage, even when a switch having a low dielectric strength is employed, it is possible to discharge the electric charges accumulated in the gate of the switch. In other words, the power source connection circuit 41 allows a switch to have a lower dielectric strength, and there is no need to employ a switch having a high dielectric strength. In addition, in the power source connection circuit 41, the electric-charge discharging unit 43 is coupled between the ground terminal GND and the gate G1, and a current path does not exist between the output terminal 5 and the gate G1. Therefore, even if the MOS switch SW1 is turned off during normal operation in which the output terminal 5 is not short-circuited to the ground, it is possible to prevent a current from flowing from the output terminal 5 to the gate G1 of the MOS switch SW1. Thereby, excessive power consumption can be avoided.

As described above, the power source connection circuit 41 of the present invention has the aforementioned structure and operation, and therefore, even when the switch SW1 having a low dielectric strength is employed, it is possible to prevent excessive power consumption when the switch SW1 between the input terminal 3 and the output terminal 5 is turned off, and also to discharge the electric charges accumulated in the gate G1 of the switch SW1.

Incidentally, the electric-charge discharging unit 43 may have a rectifier unit having a threshold voltage which is equal to or lower than a breakdown voltage of a Zener diode and which is equal to or higher than a threshold voltage of the switch SW1, and when forming a current path, connect the rectifier unit between the gate G1 and the ground terminal GND to form a current path.

FIG. 5A is a conceptual diagram of a more detailed power source connection circuit of the present invention.

In a power source connection circuit 51, an electric-charge discharging unit 53 is configured to have a rectifier unit 55 and a switch unit SW2. A threshold voltage of the rectifier unit 55 is equal to or lower than a breakdown voltage of a Zener diode and equal to or higher than a threshold voltage of a MOS switch SW1.

While the output terminal 5 is short-circuited, that is, when an output voltage $V_{OUT}$ falls below a reference voltage, the switch unit SW2 connects the rectifier unit 55 between the gate G1 and the ground terminal GND so as to form a current path between the gate G1 and the ground terminal GND. While the output terminal 5 is not short-circuited, that is, when the output voltage $V_{OUT}$ exceeds the reference voltage, the switch unit SW2 disconnects the rectifier unit 55 between the gate G1 and the ground terminal GND. One terminal K5 of the rectifier unit 55 is connected to the gate G1 and the other terminal A5 of the rectifier unit 55 is connected to one terminal of the switch unit SW2. The other terminal of the switch unit SW2 is connected to the ground terminal GND.

When the output terminal 5 is short-circuited and the output voltage $V_{OUT}$ falls below the reference voltage, the switch unit SW2 is turned on to connect the rectifier unit 55 between the gate G1 and the ground terminal GND to form a current path between the gate G1 and the ground terminal GND. At the same time, a voltage of the gate G1 is clamped to the threshold voltage of the rectifier unit 55. Then, the electric-charge discharging unit 53 discharges the electric charges accumulated in the gate G1 to the ground terminal GND. Then, if the short circuit of the output terminal 5 is removed, an input voltage $V_{IN}$ is transmitted from the input terminal 3 to the output terminal 5 as an output voltage $V_{OUT}$, and the output voltage $V_{OUT}$ exceeds the reference voltage. If the output terminal 5 remains short-circuited, the output voltage $V_{OUT}$ falls below the reference voltage, and accordingly, the switch unit SW2 is turned on to connect the rectifier unit 55 between the gate G1 and the ground terminal GND, and forms a current path from the gate G1 to the ground terminal GND which is different from the output terminal 5 to discharge the electric charges accumulated in the gate G1 to the ground terminal GND.

In this manner, since the power source connection circuit 51 is configured to form a current path from the gate G1 to the ground terminal GND which is different from the output terminal 5 while the output terminal 5 is short-circuited, even when a switch having a low dielectric strength is employed, it is possible to discharge the electric charges accumulated in the gate of the switch. In other words, the power source connection circuit 51 allows a switch to have a lower dielectric strength, and there is no need to employ a switch having a high dielectric strength. In addition, in the power source connection circuit 51, the electric-charge discharging unit 53 is coupled between the ground terminal GND which is different from the output terminal 5 and the gate G1, and a current path does not exist between the output terminal 5 and the gate G1. Therefore, even if the MOS switch SW1 is turned off during normal operation in which the output terminal 5 is not short-circuited to the ground, it is possible to prevent a current from flowing from the output terminal 5 to the gate G1 of the MOS switch SW1. Thereby, excessive power consumption can be avoided.

As described above, the power source connection circuit 51 of the present invention has the aforementioned structure and operation, and therefore, even when the switch SW1 having a low dielectric strength is employed, it is possible to prevent excessive power consumption when the switch SW1 between the input terminal 3 and the output terminal 5 is turned off, and also to discharge the electric charges accumulated in the gate G1 of the switch SW1.

FIG. 5B is a conceptual diagram of a more detailed power source connection circuit of the present invention.

In the power source connection circuit 51 of FIG. 5B, a rectifier unit 59 and the switch unit are coupled to each other in series between the gate G1 and the ground terminal GND, as the power source connection circuit 51 of FIG. 5A. The difference between FIG. 5A and FIG. 5B is that in an electric-charge discharging unit 57, the position of the rectifier unit 59 and the position of the switch unit are opposite. More specifically, in the power source connection circuit 51, one terminal of a switch unit SW3 is connected to the gate G1, the other terminal of the switch unit SW3 is connected to one terminal K5 of the rectifier unit 59, and the other terminal A5 of the rectifier unit 59 is connected to the ground terminal GND.

The power source connection circuit 51 operates in the same manner as the power source connection circuit 41 and has the same advantageous effect as the power source connection circuit 41. Hereinafter, specific embodiments of the power source connection circuit of the present invention will be described.

First Embodiment

Figure 6:
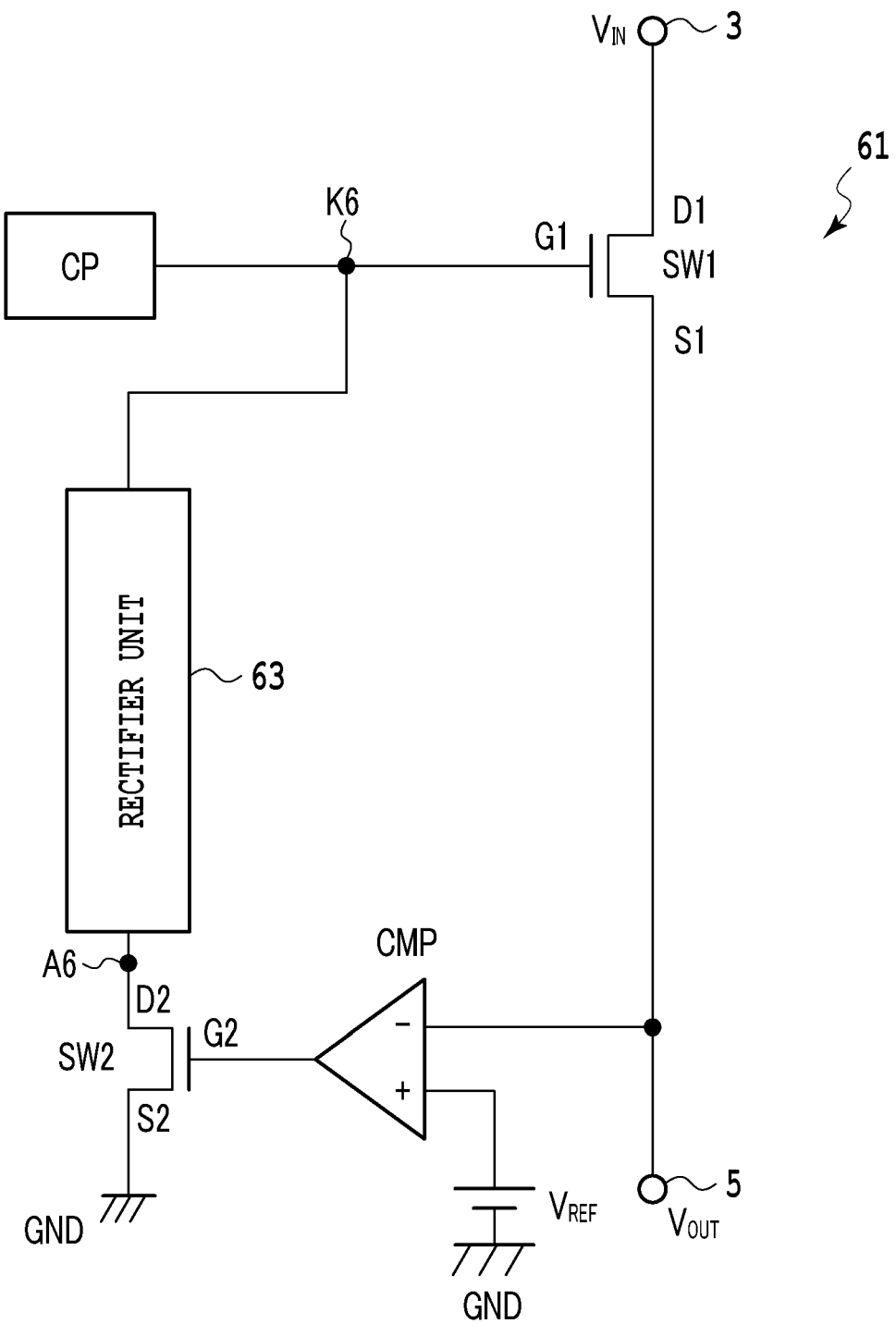
FIG. 6 is a circuit diagram of a power source connection circuit according to a first embodiment of the present invention.

FIG. 6 is a circuit diagram of a power source connection circuit 61 according to a first embodiment of the present invention.

In FIG. 6, the power source connection circuit 61 includes a MOS switch SW1 for transmitting an input voltage $V_{IN}$ from an input terminal 3 to an output terminal 5 as an output voltage $V_{OUT}$ and a step-up circuit CP for supplying electric charges to a gate G1 of the MOS switch SW1. Further, the power source connection circuit 61 includes a rectifier unit 63 for discharging electric charges accumulated in the gate G1 to a ground terminal GND and a comparator CMP for comparing the output voltage $V_{OUT}$ with a reference voltage $V_{REF}$. Still further, the power source connection circuit 61 includes a switch SW2 for causing electric charges to flow from the gate G1 to the ground terminal GND according to an output of the comparator CMP.

A drain D1 of the MOS switch SW1 is connected to the input terminal 3, a source S1 of the MOS switch SW1 is connected to the output terminal 5, and the gate G1 of the MOS switch SW1 is connected to the step-up circuit CP. Further, the gate G1 is connected to one terminal K6 of the rectifier unit 63, the other terminal A6 of the rectifier unit 63 is connected to a drain D2 of the switch SW2, and a source S2 of the switch SW2 is connected to the ground terminal GND. The MOS switch SW1 and the switch SW2 include an N-channel MOS transistor. A gate G2 of the switch SW2 is connected to an output terminal of the comparator CMP, and a plus input terminal and a minus input terminal of the comparator CMP are connected to the reference voltage $V_{REF}$ and the output terminal 5, respectively. When the output voltage $V_{OUT}$ falls below the reference voltage $V_{REF}$, the comparator CMP outputs to the gate G2 a detection signal indicating that the output terminal 5 is short-circuited. The detection signal has a signal level at which the switch SW2 can be turned on. The reference voltage $V_{REF}$ is a voltage acted when the output terminal 5 is short-circuited. The switch SW2 is on or off according to the detection signal.

Here, the drain D2 of the switch SW2 may be connected to the gate G1, and the terminal K6 of the rectifier unit 63 may be connected to the source S2 of the switch SW2. In short, any arrangement may be employed as long as when the output voltage $V_{OUT}$ falls below the reference voltage $V_{REF}$, the rectifier unit 63 is connected between the gate G1 and the ground terminal GND and a current path is formed between the gate G1 and the ground terminal.

Next, with reference to FIG. 6, the operation of the power source connection circuit 61 during normal operation and in a short-circuit state will be described separately.

(During Normal Operation)

The step-up circuit CP supplies electric charges to the gate G1 of the MOS switch SW1 and increases the gate voltage to turn on the MOS switch SW1. Once the MOS switch SW1 is turned on, an input voltage $V_{IN}$ is transmitted from the input terminal 3 to the output terminal 5 as an output voltage $V_{OUT}$. Since the output terminal 5 is not short-circuited, the output voltage $V_{OUT}$ is higher than the reference voltage $V_{REF}$. Since the output voltage $V_{OUT}$ is higher than the reference voltage $V_{REF}$, the comparator CMP outputs LOW to the gate G2 of the switch SW2 as a detection signal. Since the detection signal is LOW, the MOS switch SW2 is off. In this case, the rectifier unit 63 is floating and the connection between the gate G1 and the ground terminal GND is cut off. Then, when the step-up circuit CP stops supplying electric charges to the gate G1 to turn off the MOS switch SW1, the input voltage $V_{IN}$ is not transmitted to the output terminal 5. Since there is no current path between the gate G1 of the MOS switch SW1 and the output terminal 5, a current does not flow from the output terminal 5 to the gate G1.

In this manner, even if the MOS switch SW1 is turned off during normal operation of the power source connection circuit 61, since there is no current path between the gate G1 of the MOS switch SW1 and the output terminal 5, it is possible to prevent a current from flowing from the output terminal 5 to the gate G1 of the MOS switch SW1. Thereby, excessive power consumption can be avoided.

(In Short Circuit State)

While the MOS switch SW1 is on by the step-up circuit CP, once the output terminal 5 is short-circuited to the ground, the output voltage $V_{OUT}$ falls below the reference voltage $V_{REF}$. Then, the comparator CMP outputs HI to the gate G2 of the switch SW2 as a detection signal indicating that the output terminal 5 is short-circuited. Since the detection signal is HI, the switch SW2 is turned on.

When the switch SW2 is turned on, a voltage equal to a gate-source voltage $V_{GS}$ of the MOS switch SW1 is applied to the rectifier unit 63. When the gate-source voltage $V_{GS}$ of the MOS switch SW1 exceeds a threshold voltage of the rectifier unit 63, the rectifier unit 63 is turned on to discharge the electric charges accumulated in the gate G1 of the MOS switch SW1 to the ground terminal GND.

In this manner, since the power source connection circuit 61 is configured to form a current path from the gate G1 to the ground terminal GND which is different from the output terminal 5 so that a gate voltage does not need to exceed a large threshold voltage, even when the MOS switch SW1 having a low dielectric strength is employed, it is possible to discharge the electric charges accumulated in the gate of the switch. In other words, the power source connection circuit 61 allows a switch to have a lower dielectric strength, and there is no need to employ a switch having a high dielectric strength.

As described above, the power source connection circuit 61 of the present embodiment has the aforementioned structure and operation, and therefore, even when the switch SW1 having a low dielectric strength is employed, it is possible to prevent excessive power consumption when the switch SW1 between the input terminal 3 and the output terminal 5 is turned off, and also to discharge the electric charges accumulated in the gate G1 of the switch SW1.

Second Embodiment

Figure 7:
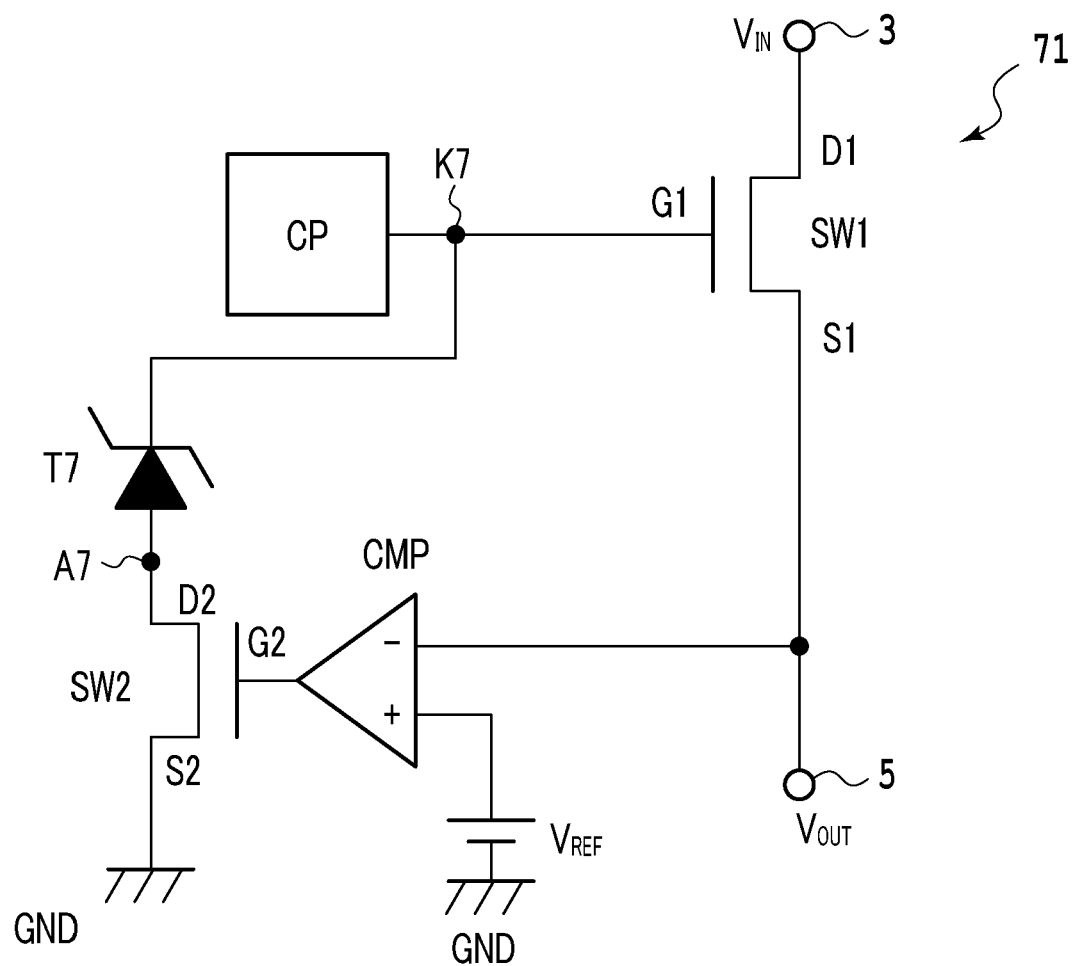
FIG. 7 is a circuit diagram of a power source connection circuit according to a second embodiment of the present invention.

FIG. 7 is a circuit diagram of a power source connection circuit 71 according to a second embodiment of the present invention. In FIG. 7, the power source connection circuit 71 includes a switch SW1 for transmitting an input voltage $V_{IN}$ from an input terminal 3 to an output terminal 5 as an output voltage $V_{OUT}$ and a step-up circuit CP for supplying electric charges to a gate G1 of the switch SW1. Further, the power source connection circuit 71 includes a Zener diode T7 for discharging electric charges accumulated in the gate G1 to a ground terminal GND and a comparator CMP for comparing the output voltage $V_{OUT}$ with a reference voltage $V_{REF}$. Still further, the power source connection circuit 71 includes a switch SW2 for causing electric charges to flow from the gate G1 to the ground terminal GND according to an output of the comparator CMP. In the power source connection circuit 71 of the second embodiment, the rectifier unit 63 of the first embodiment includes one Zener diode T7. One terminal K7 of the Zener diode T7 is a cathode and the other terminal A7 is an anode. The switch SW1 is a MOS switch including an N-channel MOS transistor.

A drain D1 of the switch SW1 is connected to the input terminal 3, a source S1 of the switch SW1 is connected to the output terminal 5, and the gate G1 of the switch SW1 is connected to the step-up circuit CP. Further, the gate G1 is connected to the cathode K7 of the Zener diode T7, the anode A7 of the Zener diode T7 is connected to a drain D2 of the switch SW2, and a source S2 of the switch SW2 is connected to the ground terminal GND. The switch SW1 and the switch SW2 include an N-channel MOS transistor. A gate G2 of the switch SW2 is connected to an output terminal of the comparator CMP, and a plus input terminal and a minus input terminal of the comparator CMP are connected to the reference voltage $V_{REF}$ and the output terminal 5, respectively. When the output voltage $V_{OUT}$ falls below the reference voltage $V_{REF}$, the comparator CMP outputs to the gate G2 a detection signal indicating that the output terminal 5 is short-circuited. The detection signal has a signal level at which the switch SW2 can be turned on. The reference voltage $V_{REF}$ is a voltage acted when the output terminal 5 is short-circuited. The switch SW2 is on or off according to the detection signal.

Here, the drain D2 of the switch SW2 may be connected to the gate G1, and the cathode K7 of the Zener diode T7 may be connected to the source S2 of the switch SW2. In short, any arrangement may be employed as long as the switch SW2 is arranged between the ground terminal GND and the gate G1 so that when the output voltage $V_{OUT}$ falls below the reference voltage $V_{REF}$, the Zener diode T7 is connected between the ground terminal GND and the gate G1 such that a forward direction of the Zener diode T7 points in the direction from the ground terminal GND toward the gate G1, and the electric charges accumulated in the gate G1 of the switch SW1 can be discharged to the ground terminal GND. In addition, any arrangement may be employed as long as the switch SW2 is arranged between the ground terminal GND and the gate G1 so that when the output voltage $V_{OUT}$ is higher than the reference voltage $V_{REF}$, the Zener diode T7 is disconnected between the ground terminal GND and the gate G1.

Next, with reference to FIG. 7, the operation of the power source connection circuit 71 during normal operation and in a short-circuit state will be described separately.

(During Normal Operation)

The step-up circuit CP supplies electric charges to the gate G1 of the switch SW1 and increases the gate voltage to turn on the switch SW1. Once the switch SW1 is turned on, an input voltage $V_{IN}$ is transmitted from the input terminal 3 to the output terminal 5 as an output voltage $V_{OUT}$. Since the output terminal 5 is not short-circuited, the output voltage $V_{OUT}$ is higher than the reference voltage $V_{REF}$. Since the output voltage $V_{OUT}$ is higher than the reference voltage $V_{REF}$, the comparator CMP outputs LOW to the gate G2 of the switch SW2 as a detection signal. Since the detection signal is LOW, the switch SW2 is off. In this case, the Zener diode T7 is floating and the connection between the gate G1 and the ground terminal GND is cut off. Then, when the step-up circuit CP stops supplying electric charges to the gate G1 to turn off the switch SW1, the input voltage $V_{IN}$ is not transmitted to the output terminal 5. Since there is no current path between the gate G1 of the switch SW1 and the output terminal 5, a current does not flow from the output terminal 5 to the gate G1.

In this manner, even if the switch SW1 is turned off during normal operation of the power source connection circuit 71, since there is no current path between the gate G1 of the switch SW1 and the output terminal 5, it is possible to prevent a current from flowing from the output terminal 5 to the gate G1 of the switch SW1. Thereby, excessive power consumption can be avoided.

(In Short Circuit State)

While the switch SW1 is on by the step-up circuit CP, once the output terminal 5 is short-circuited to the ground, the output voltage $V_{OUT}$ falls below the reference voltage $V_{REF}$. Then, the comparator CMP outputs HI to the gate G2 of the switch SW2 as a detection signal indicating that the output terminal 5 is short-circuited. Since the detection signal is HI, the switch SW2 is turned on.

When the switch SW2 is turned on, a voltage equal to a gate-source voltage $V_{GS}$ of the switch SW1 is applied to the Zener diode T7. When the gate-source voltage $V_{GS}$ of the switch SW1 exceeds a breakdown voltage $V_D$, the Zener diode T7 is turned on to discharge the electric charges accumulated in the gate G1 of the switch SW1 to the ground terminal GND.

In this manner, since the power source connection circuit 71 includes one Zener diode T7, when a maximum gate-source voltage $V_{GS}MAX$ allowed by the switch SW1 is higher than a breakdown voltage $V_D$, it is possible to discharge the electric charges accumulated in the gate G1. That is, it is not necessary to consider a threshold voltage Vf in a forward direction (a forward voltage Vf). Accordingly, even when a switch having a low dielectric strength is employed, it is possible to discharge the electric charges accumulated in the gate of the switch. In other words, the power source connection circuit 71 allows a switch to have a lower dielectric strength, and there is no need to employ a switch having a high dielectric strength.

As described above, the power source connection circuit 71 of the present embodiment has the aforementioned structure and operation, and therefore, even when the switch SW1 having a low dielectric strength is employed, it is possible to prevent excessive power consumption when the switch SW1 between the input terminal 3 and the output terminal 5 is turned off, and also to discharge the electric charges accumulated in the gate G1 of the switch SW1.

Incidentally, since a rectifier unit includes one Zener diode, the power source connection circuit 71 of the present embodiment produces an advantageous effect that there is little variation in the threshold voltage for forming a current path between the gate G1 and the ground terminal GND.

In addition, since the power source connection circuit 71 of the present embodiment uses reverse current voltage characteristics in a breakdown voltage, it is possible to clamp a voltage of the gate G1 to the breakdown voltage in a very short time to discharge the electric charges accumulated in the gate G1. That is, since the reverse current voltage characteristic of the Zener diode is almost vertical in the breakdown voltage, the power source connection circuit 71 allows a much larger current to pass therethrough, as compared to a circuit using forward current voltage characteristics in a forward threshold voltage.

The power source connection circuit of the present embodiment as described above includes a switch for transmitting an input voltage from an input terminal to an output terminal as an output voltage; a step-up circuit for supplying electric charges to a gate of the switch; and an electric-charge discharging unit having one Zener diode, when the output voltage falls below a reference voltage, being connected between a ground terminal and the gate such that a forward direction of the Zener diode points in the direction from the ground terminal toward the gate to discharge electric charges accumulated in the gate to the ground terminal, wherein when the output voltage is higher than the reference voltage, the Zener diode is disconnected between the ground terminal and the gate.

In the above-described power source connection circuit, the power source connection circuit of the present embodiment further includes a short-circuit detection unit for outputting a detection signal indicating that the output terminal is short-circuited when the output voltage falls below the reference voltage, wherein the electric-charge discharging unit discharges electric charges accumulated in the gate of the switch to the ground terminal according to the detection signal.

Third Embodiment

Figure 8:
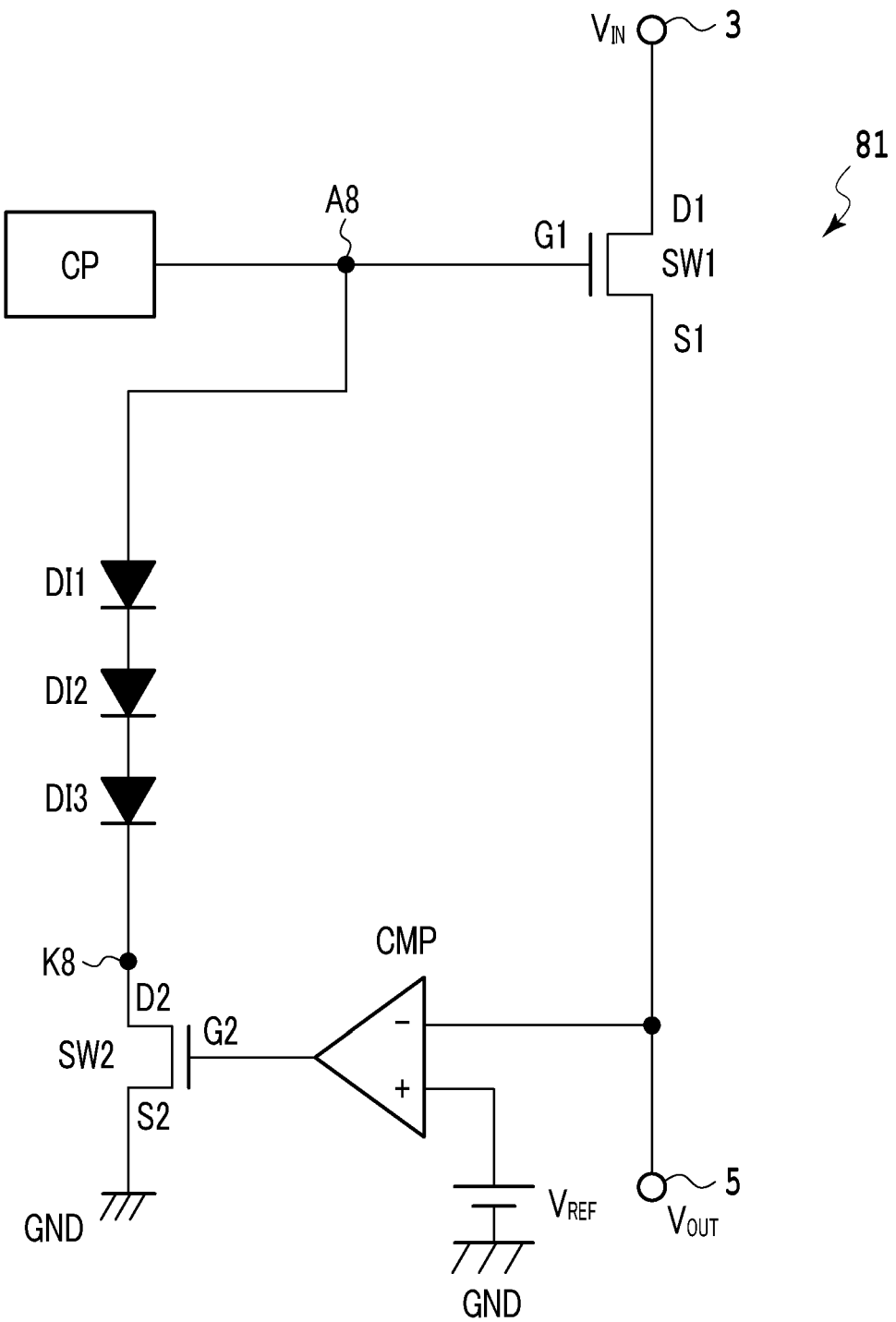
FIG. 8 is a circuit diagram of a power source connection circuit according to a third embodiment of the present invention.

FIG. 8 is a circuit diagram of a power source connection circuit 81 according to a third embodiment of the present invention. In FIG. 8, the power source connection circuit 81 includes a switch SW1 for transmitting an input voltage $V_{IN}$ from an input terminal 3 to an output terminal 5 as an output voltage $V_{OUT}$ and a step-up circuit CP for supplying electric charges to a gate G1 of the switch SW1. Further, the power source connection circuit 81 includes diodes DI1 to DI3 for discharging electric charges accumulated in the gate G1 to a ground terminal GND and a comparator CMP for comparing the output voltage $V_{OUT}$ with a reference voltage $V_{REF}$. Still further, the power source connection circuit 81 includes a switch SW2 for causing electric charges to flow from the gate G1 to the ground terminal GND according to an output of the comparator CMP. In the power source connection circuit 81 of the third embodiment, the rectifier unit 63 of the first embodiment includes one or more diodes DI1 to DI3 which are coupled in series such that forward directions of the diodes DI1 to DI3 point in the direction from the gate toward the ground terminal. The diodes DI1 to DI3 have one terminal A8 which is an anode at a series-connected end and the other terminal K8 which is a cathode at the other series-connected end. The sum of the forward threshold voltage Vf of each of the diodes DI1 to DI3 is a voltage value equal to or lower than a breakdown voltage $V_D$ of a Zener diode T7.

A drain D1 of the switch SW1 is connected to the input terminal 3, a source S1 of the switch SW1 is connected to the output terminal 5, and the gate G1 of the switch SW1 is connected to the step-up circuit CP. Further, the gate G1 is connected to the anode A8 of the diode DI1, a cathode of the diode DI1 is connected to an anode of the diode DI2, a cathode of the diode DI2 is connected to an anode of the diode DI3, a cathode of the diode DI3 is connected to a drain D2 of the switch SW2, and a source S2 of the switch SW2 is connected to the ground terminal GND. The switch SW1 and the switch SW2 include an N-channel MOS transistor. A gate G2 of the switch SW2 is connected to an output terminal of the comparator CMP, and a plus input terminal and a minus input terminal of the comparator CMP are connected to the reference voltage $V_{REF}$ and the output terminal 5, respectively. When the output voltage $V_{OUT}$ falls below the reference voltage $V_{REF}$, the comparator CMP outputs to the gate G2 a detection signal indicating that the output terminal 5 is short-circuited. The detection signal has a signal level at which the switch SW2 can be turned on. The reference voltage $V_{REF}$ is a voltage acted when the output terminal 5 is short-circuited. The switch SW2 is on or off according to the detection signal.

Here, the drain D2 of the switch SW2 may be connected to the gate G1 and the anode of the diode DI1 may be connected to the source S2 of the switch SW2. In short, any arrangement may be employed as long as the switch SW2 is arranged between the ground terminal GND and the gate G1 so that when the output voltage $V_{OUT}$ falls below the reference voltage $V_{REF}$, the diodes DI1 to DI3 are connected between the gate G1 and the ground terminal GND such that forward directions of the diodes DI1 to DI3 point in the direction from the gate G1 toward the ground terminal GND, and the electric charges accumulated in the gate G1 of the switch SW1 can be discharged to the ground terminal GND. In addition, any arrangement may be employed as long as the switch SW2 is arranged between the ground terminal GND and the gate G1 so that when the output voltage $V_{OUT}$ is higher than the reference voltage $V_{REF}$, the diodes DI1 to DI3 are disconnected between the ground terminal GND and the gate G1.

Next, with reference to FIG. 8, the operation of the power source connection circuit 81 during normal operation and in a short-circuit state will be described separately.

(During Normal Operation)

The step-up circuit CP supplies electric charges to the gate G1 of the switch SW1 and increases the gate voltage to turn on the switch SW1. Once the switch SW1 is turned on, an input voltage $V_{IN}$ is transmitted from the input terminal 3 to the output terminal 5 as an output voltage $V_{OUT}$. Since the output terminal 5 is not short-circuited, the output voltage $V_{OUT}$ is higher than the reference voltage $V_{REF}$. Since the output voltage $V_{OUT}$ is higher than the reference voltage $V_{REF}$, the comparator CMP outputs LOW to the gate G2 of the switch SW2 as a detection signal. Since the detection signal is LOW, the switch SW2 is off. In this case, the diodes DI1 to DI3 are floating and the connection between the gate G1 and the ground terminal GND is cut off. Then, when the step-up circuit CP stops supplying electric charges to the gate G1 to turn off the switch SW1, the input voltage $V_{IN}$ is not transmitted to the output terminal 5. Since there is no current path between the gate G1 of the switch SW1 and the output terminal 5, a current does not flow from the output terminal 5 to the gate G1.

In this manner, even if the switch SW1 is turned off during normal operation of the power source connection circuit 81, since there is no current path between the gate G1 of the switch SW1 and the output terminal 5, it is possible to prevent a current from flowing from the output terminal 5 to the gate G1 of the switch SW1. Thereby, excessive power consumption can be avoided.

(In Short Circuit State)

While the switch SW1 is on by the step-up circuit CP, once the output terminal 5 is short-circuited to the ground, the output voltage $V_{OUT}$ falls below the reference voltage $V_{REF}$. Then, the comparator CMP outputs HI to the gate G2 of the switch SW2 as a detection signal indicating that the output terminal 5 is short-circuited. Since the detection signal is HI, the switch SW2 is turned on.

When the switch SW2 is turned on, a voltage equal to a gate-source voltage $V_{GS}$ of the switch SW1 is applied to the diodes DI1 to DI3. When the gate-source voltage $V_{GS}$ of the switch SW1 exceeds a threshold voltage, the diodes DI1 to DI3 are turned on to discharge the electric charges accumulated in the gate G1 of the switch SW1 to the ground terminal GND. In the present embodiment, the threshold voltage is a voltage value equal to or lower than a breakdown voltage $V_D$ of the Zener diode and equal to or higher than a threshold voltage Vth of the switch SW1. Incidentally, the number of diodes is not limited to three but may be n (n is an integer) as long as the threshold voltage is equal to or lower than a breakdown voltage $V_D$ of the Zener diode and is equal to or higher than a threshold voltage Vth of the switch SW1.

In this manner, the power source connection circuit 81 can discharge the electric charges accumulated in the gate G1 when a maximum gate-source voltage $V_{GS}$MAX allowed by the switch SW1 is higher than a threshold voltage. Accordingly, even when a switch having a low dielectric strength is employed, it is possible to discharge the electric charges accumulated in the gate of the switch. In other words, the power source connection circuit 81 allows a switch to have a lower dielectric strength, and there is no need to employ a switch having a high dielectric strength.

As described above, the power source connection circuit 81 of the present embodiment has the aforementioned structure and operation, and therefore, even when the switch SW1 having a low dielectric strength is employed, it is possible to prevent excessive power consumption when the switch SW1 between the input terminal 3 and the output terminal 5 is turned off, and also to discharge the electric charges accumulated in the gate G1 of the switch SW1.

Fourth Embodiment

Figure 9:
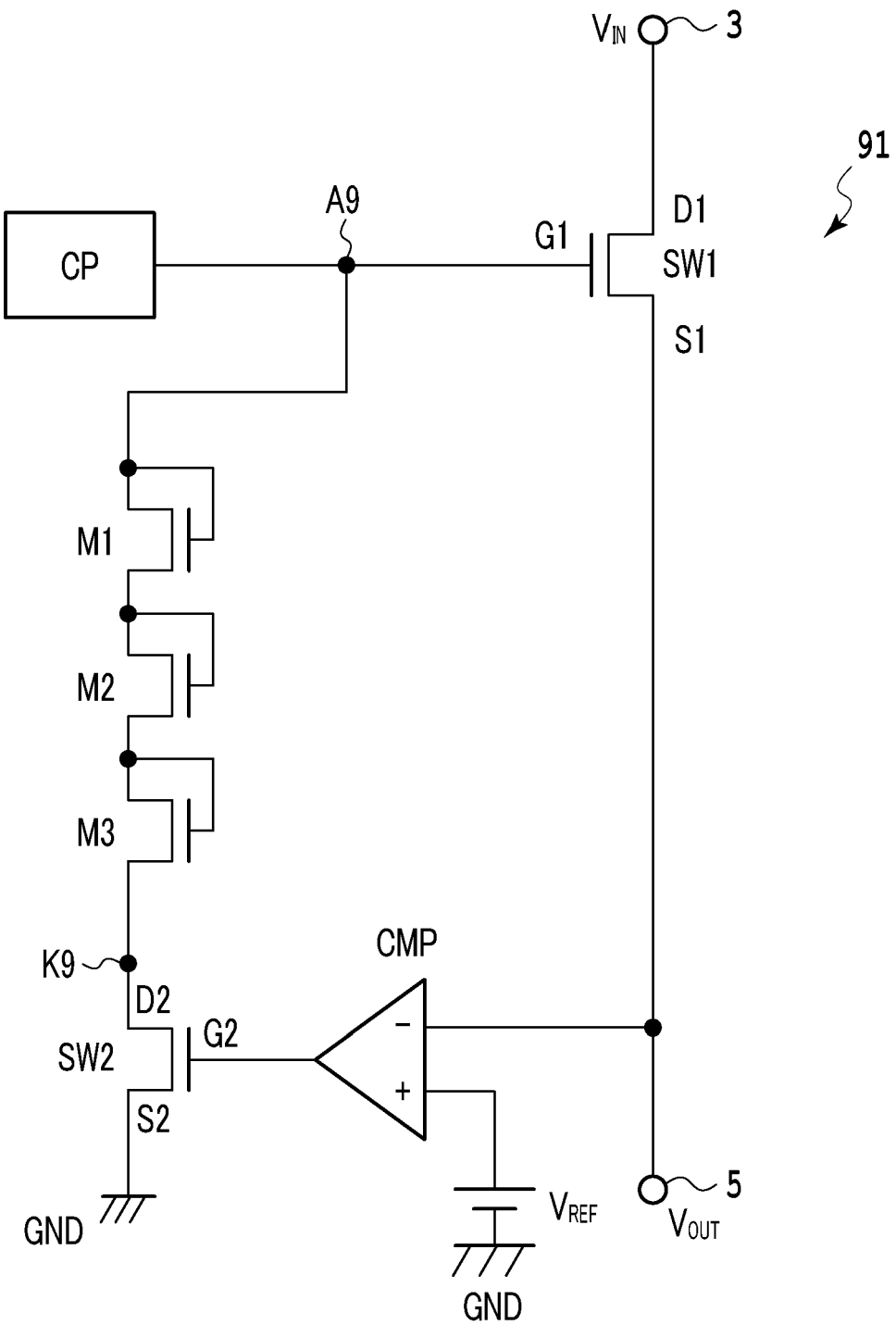
FIG. 9 is a circuit diagram of a power source connection circuit according to a fourth embodiment of the present invention.

FIG. 9 is a circuit diagram of a power source connection circuit of a fourth embodiment.

In a power source connection circuit 91 of the present embodiment, the diodes DI1 to DI3 in the power source connection circuit 81 of the third embodiment are replaced with diode-connected MOS transistors M1 to M3. The MOS transistors M1 to M3 are N-channel MOS transistors, and their respective gates and drains are coupled. More specifically, a drain A9 of the MOS transistor M1 is connected to the gate G1 at the same contact, and a source of the MOS transistor M1 is connected to a drain of the MOS transistor M2. A source of the MOS transistor M2 is connected to a drain of the MOS transistor M3, and a source K9 of the MOS transistor M3 is connected to a drain D2 of a switch SW2.

Incidentally, not limiting to the N-channel MOS transistors, the power source connection circuit 91 may include diode-connected P-channel MOS transistors. Further, in the same manner as the third embodiment, the number of MOS transistors is not limited to three but may be n (n is an integer).

The power source connection circuit 91 of the present embodiment has the same operation and advantageous effect as the power source connection circuit 81 of the third embodiment, and thus a description thereof will be omitted.

Fifth Embodiment

Figure 10:
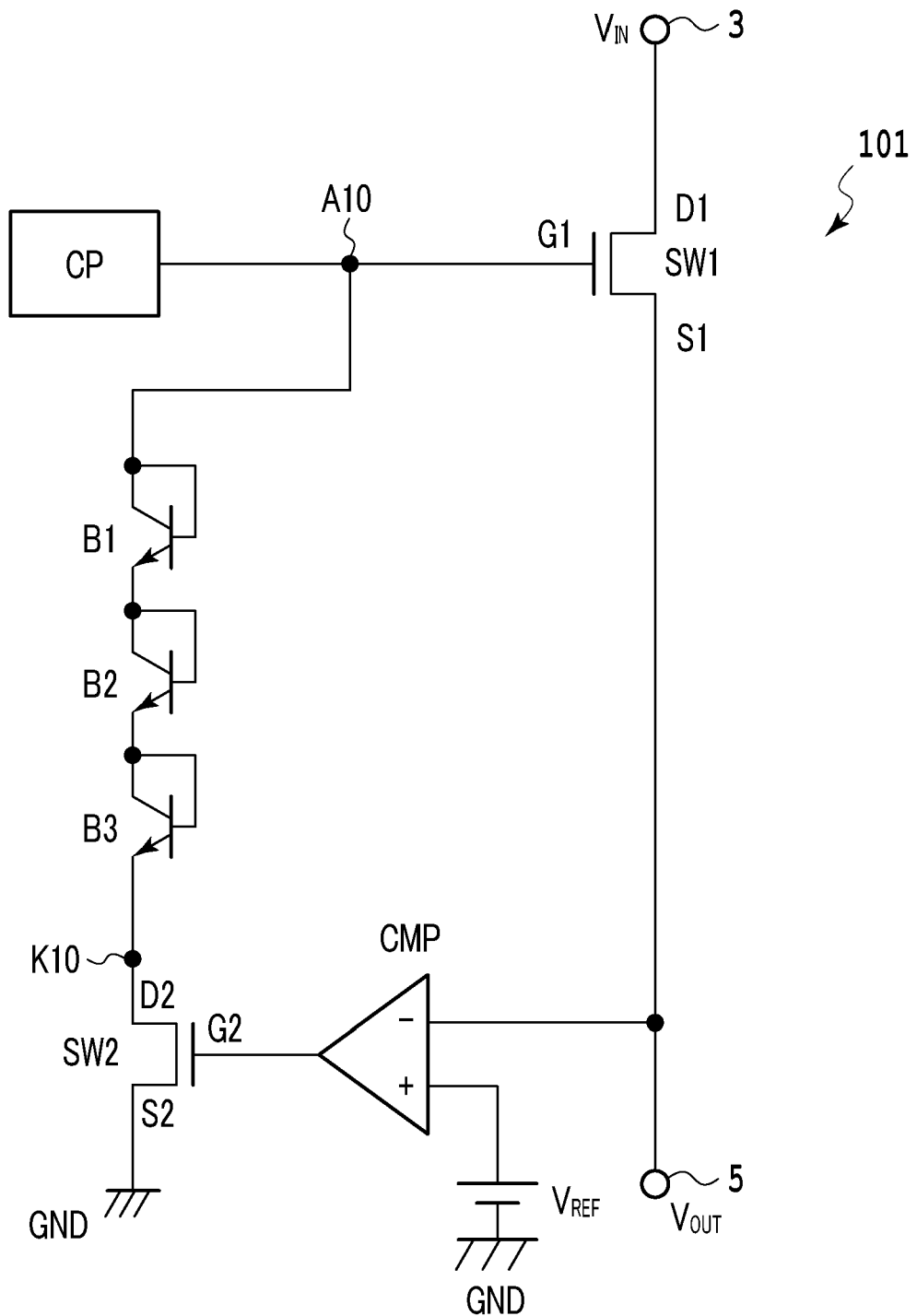
FIG. 10 is a circuit diagram of a power source connection circuit according to a fifth embodiment of the present invention.

FIG. 10 is a circuit diagram of a power source connection circuit of a fifth embodiment.

In a power source connection circuit 101 of the present embodiment, the diodes DI1 to DI3 in the power source connection circuit 81 of the third embodiment are replaced with diode-connected bipolar transistors B1 to B3. The bipolar transistors B1 to B3 are NPN transistors and their respective collectors and bases are coupled. More specifically, a collector A10 of the bipolar transistor B1 is connected to the gate G1 at the same contact, and an emitter of the bipolar transistor B1 is connected to a collector of the bipolar transistor B2. An emitter of the bipolar transistor B2 is connected to a collector of the bipolar transistor B3, and an emitter K10 of the bipolar transistor B3 is connected to a drain D2 of a switch SW2.

Incidentally, not limiting to the NPN transistors, the power source connection circuit 101 may include diode-connected PNP transistors. Further, in the same manner as the third embodiment, the number of bipolar transistors is not limited to three but may be n (n is an integer).

The power source connection circuit 101 of the present embodiment has the same operation and advantageous effect as the power source connection circuit 81 of the third embodiment, and thus a description thereof will be omitted.

Sixth Embodiment

Figure 11:
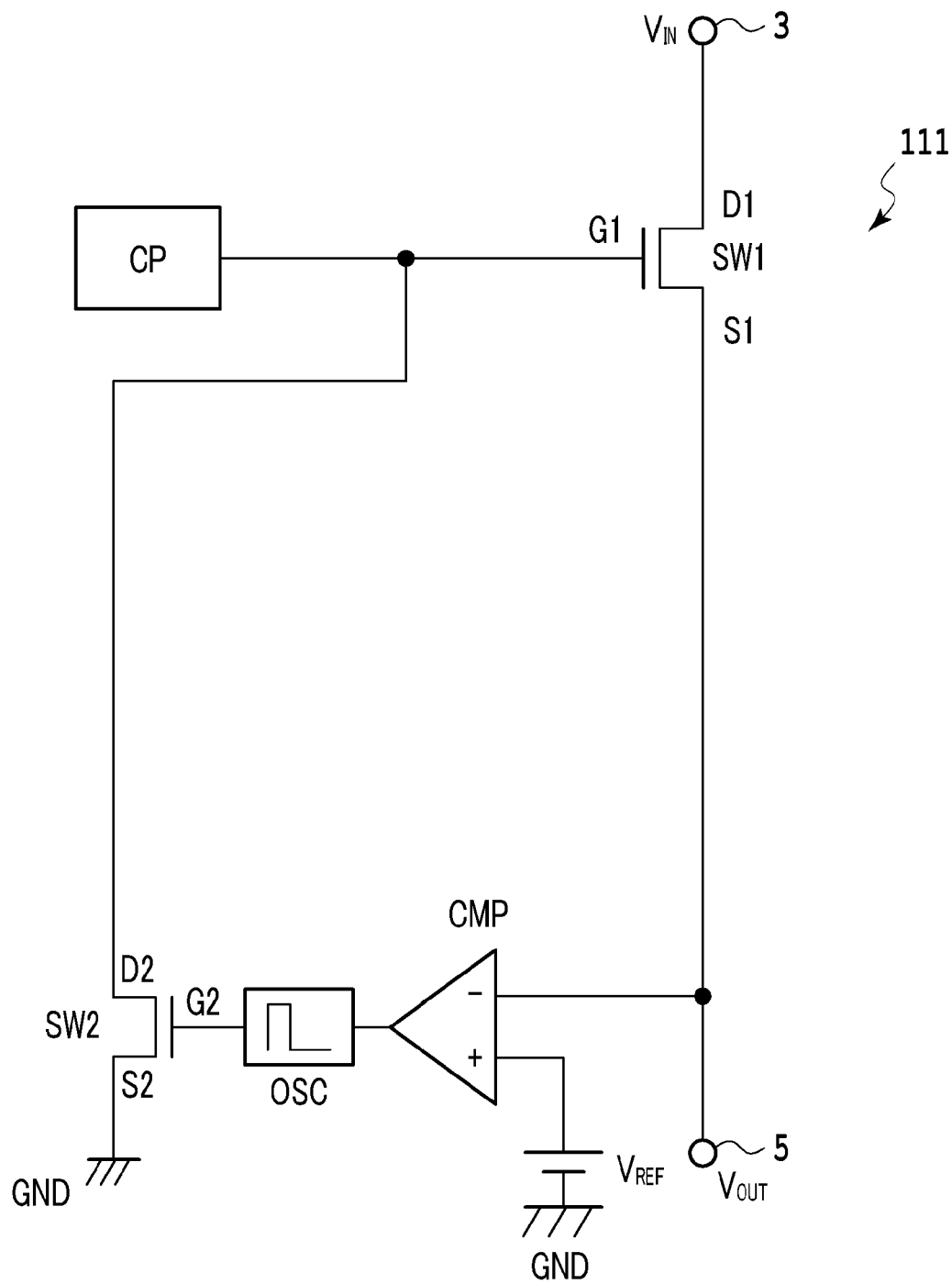
FIG. 11 is a circuit diagram of a power source connection circuit according to a sixth embodiment of the present invention.

FIG. 11 is a circuit diagram of a power source connection circuit of a sixth embodiment.

In FIG. 11, a power source connection circuit 111 includes a MOS switch SW1 for transmitting an input voltage $V_{IN}$ from an input terminal 3 to an output terminal 5 as an output voltage $V_{OUT}$ and a step-up circuit CP for supplying electric charges to a gate G1 of the MOS switch SW1. Further, the power source connection circuit 111 includes a switch SW2 coupled between the gate G1 and a ground terminal GND to discharge electric charges accumulated in the gate G1 to the ground terminal GND, an oscillator circuit OSC for providing a clock signal to a gate of the switch SW2, and a comparator CMP for comparing the output voltage $V_{OUT}$ with a reference voltage $V_{REF}$ to enable the oscillator circuit OSC according to its comparison result. An output terminal of the comparator CMP is connected to an enable terminal of the oscillator circuit OSC, and an output terminal of the oscillator circuit OSC is connected to the gate G2 of the switch SW2. The switch SW2 includes an N-channel MOS transistor. The oscillator circuit OSC is enabled if HI is received at the enable terminal, and outputs a clock signal having a predetermined frequency. The oscillator circuit OSC is disabled if LOW is received at the enable terminal, and goes inactive to output LOW.

In the power source connection circuit 111 of the present embodiment, an electric-charge discharging unit includes the switch SW2 and the oscillator circuit OSC which is a clock signal providing unit.

Next, with reference to FIG. 11, the operation of the power source connection circuit 111 during normal operation and in a short-circuit state will be described separately.

(During Normal Operation)

The step-up circuit CP supplies electric charges to the gate G1 of the switch SW1 and increases the gate voltage to turn on the switch SW1. Once the switch SW1 is turned on, an input voltage $V_{IN}$ is transmitted from the input terminal 3 to the output terminal 5 as an output voltage $V_{OUT}$. Since the output terminal 5 is not short-circuited, the output voltage $V_{OUT}$ is higher than the reference voltage $V_{REF}$. Since the output voltage $V_{OUT}$ is higher than the reference voltage $V_{REF}$, the comparator CMP outputs LOW to the enable terminal of the oscillator circuit OSC as a detection signal. Then, the oscillator circuit OSC is disabled and outputs LOW to the gate G2. Then, the switch SW2 is turned off. That is, a current path from the gate G1 to the ground terminal GND is interrupted. Then, when the step-up circuit CP stops supplying electric charges to the gate G1 to turn off the switch SW1, the input voltage $V_{IN}$ is not transmitted to the output terminal 5. Since there is no current path between the gate G1 of the switch SW1 and the output terminal 5, a current does not flow from the output terminal 5 to the gate G1.

In this manner, even if the switch SW1 is turned off during normal operation of the power source connection circuit 111, since there is no current path between the gate G1 of the switch SW1 and the output terminal 5, it is possible to prevent a current from flowing from the output terminal 5 to the gate G1 of the switch SW1. Thereby, excessive power consumption can be avoided.

(In Short Circuit State)

While the switch SW1 is on by the step-up circuit CP, once the output terminal 5 is short-circuited to the ground, the output voltage $V_{OUT}$ falls below the reference voltage $V_{REF}$. Then, the comparator CMP outputs HI to the enable terminal of the oscillator circuit OSC as a detection signal indicating that the output terminal 5 is short-circuited. Then, the oscillator circuit OSC is enabled and outputs a clock signal to the gate G2.

In the HI section of the clock signal, the switch SW2 is on and a current path is formed between the gate G1 and the ground terminal GND to discharge electric charges accumulated in the gate G1.

In the LOW section of the clock signal, the switch SW2 is off and the current path between the gate G1 and the ground terminal GND is interrupted. Once the current path is interrupted, electric charges are supplied to the gate G1 again by the step-up circuit CP to turn on the switch SW1. If the short circuit of the output terminal 5 is removed, the output voltage $V_{OUT}$ exceeds the reference voltage $V_{REF}$, and thus the comparator CMP outputs LOW to the enable terminal of the oscillator circuit OSC. Then, the oscillator circuit OSC is disabled and goes inactive. Also, LOW is outputted to the gate G2, and then the switch SW2 is turned off. If the output terminal 5 remains short-circuited, the output voltage $V_{OUT}$ falls below the reference voltage $V_{REF}$, and thus the comparator CMP outputs HI to the enable terminal of the oscillator circuit OSC. Then, the oscillator circuit OSC outputs a clock signal to the gate of the switch SW2 to turn on the switch SW2 in the HI section of the clock signal, and the electric charges accumulated in the gate G1 are discharged to the ground terminal.

In this manner, since the power source connection circuit 111 is configured to form a current path from the gate G1 to the ground terminal GND which is different from the output terminal 5 so that a gate voltage does not need to exceed a large threshold voltage, even when the MOS switch SW1 having a low dielectric strength is employed, it is possible to discharge the electric charges accumulated in the gate of the switch. In other words, the power source connection circuit 111 allows a switch to have a lower dielectric strength, and there is no need to employ a switch having a high dielectric strength.

In addition, since a rectifier is not employed, the power source connection circuit 111 of the present embodiment allows the MOS switch SW1 to have a lower dielectric strength by threshold voltage of the rectifier, as compared to the embodiment using a rectifier.

As described above, the power source connection circuit 111 of the present embodiment operates in such a manner that, when the output voltage $V_{OUT}$ is lower than the reference voltage $V_{REF}$, a clock signal is provided to a control terminal of the switch SW2, that is, the gate G2, and when the output voltage $V_{OUT}$ is higher than the reference voltage $V_{REF}$, a clock signal is not provided, and accordingly, even when the switch SW1 having a low dielectric strength is employed, it is possible to prevent excessive power consumption when the switch SW1 between the input terminal 3 and the output terminal 5 is turned off, and also to discharge the electric charges accumulated in the gate G1 of the switch SW1.

Incidentally, the clock signal outputted by the oscillator circuit OSC is not limited to a pulse signal in which transition from a HI state to a LOW state is periodically repeated, but may be a one-shot pulse signal in which a HI state for a predetermined period is followed by a LOW state, a two-shot pulse signal in which a HI state for a predetermined period is followed by a LOW state and then return to a HI state for a predetermined period followed by a LOW state, or a pulse signal in which a HI state for a predetermined period is followed by a LOW state and this transition is repeated multiple times.

Seventh Embodiment

Figure 12:
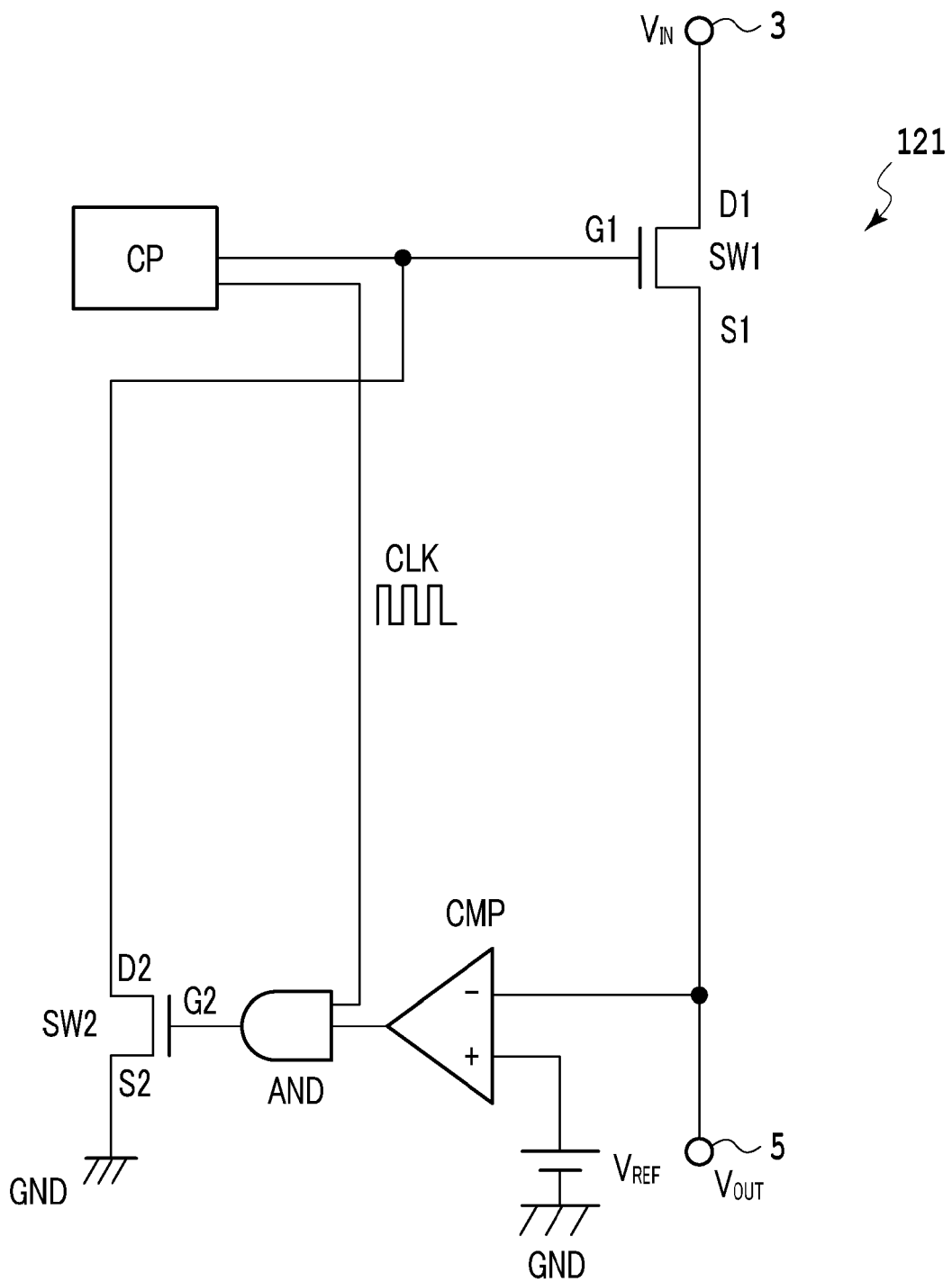
FIG. 12 is a circuit diagram of a power source connection circuit according to a seventh embodiment of the present invention.

FIG. 12 is a circuit diagram of a power source connection circuit of a seventh embodiment.

A power source connection circuit 121 of the present embodiment is based on the power source connection circuit of the sixth embodiment and includes a clock signal providing unit configured to provide an internal clock signal CLK of the step-up circuit CP to the gate G2 of the switch SW2 when the output voltage $V_{OUT}$ is lower than the reference voltage $V_{REF}$, and to stop providing an internal clock signal of the step-up circuit CP when the output voltage $V_{OUT}$ is higher than the reference voltage $V_{REF}$.

More specifically, the power source connection circuit 121 includes an AND circuit AND in which the clock signal providing unit performs the logical OR on an internal clock signal CLK used for producing a step-up voltage for the gate G1 in the step-up circuit CP and a detection signal from the comparator CMP, and a result of the operation is outputted to the switch SW2. One terminal of the AND circuit AND is connected to a node of the internal clock signal CLK of the step-up circuit and the clock signal CLK is outputted to the outside of the step-up circuit CP. The other terminal of the AND circuit AND is connected to the output terminal of the comparator CMP. Further, an output terminal of the AND circuit AND is connected to the gate G2 of the switch SW2.

When the comparator CMP outputs LOW, the AND circuit AND outputs LOW to turn off the switch SW2 irrespective of a logical value of the clock signal CLK. In other words, in this case the AND circuit AND stops providing a clock signal CLK to the switch SW2.

When the comparator CMP outputs HI, one terminal of the AND circuit AND is enabled to provide a clock signal CLK to the gate G2 of the switch SW2.

Since the power source connection circuit 121 of the present embodiment is configured to use an internal clock signal CLK of the step-up circuit CP as it is, and by use of one logic gate (AND circuit AND), the clock signal CLK from the comparator CMP is enabled or disabled, it is possible to significantly minimize the size of the circuit.

Since other operations and advantageous effect of the power source connection circuit 121 of the present embodiment are the same as those of the power source connection circuit 111 of the sixth embodiment, a description thereof will be omitted.

REFERENCE SIGNS LIST 1, 21, 31, 41, 51, 61, 71, 81, 91, 101, 111, 121 POWER SOURCE CONNECTION CIRCUIT
3 INPUT TERMINAL
5 OUTPUT TERMINAL
33, 43, 53, 57 ELECTRIC-CHARGE DISCHARGING UNIT
55, 59, 63 RECTIFIER UNIT
$V_{IN}$ INPUT VOLTAGE
$V_{OUT}$ OUTPUT VOLTAGE
$V_{GS}$ GATE-SOURCE VOLTAGE
$V_D$ BREAKDOWN VOLTAGE
Vf THRESHOLD VOLTAGE
$V_{REF}$ REFERENCE VOLTAGE
SW1 SWITCH
SW2 SWITCH UNIT
D1, D2 DRAIN
S1, S2 SOURCE
G1, G2 GATE
CP STEP-UP CIRCUIT
T1, T2, T7 ZENER DIODE
DI1, DI2, DI3 DIODE
M1, M2, M3 MOS TRANSISTOR
B1, B2, B3 BIPOLAR TRANSISTOR
A1, A2, A6, A7, A8, A9, A10 ANODE
K1, K2, K6, K7, K8, K9, K10 CATHODE
CMP COMPARATOR
GND GROUND TERMINAL
OSC OSCILLATOR CIRCUIT
AND AND CIRCUIT

The invention claimed is:

1. A power source connection circuit, comprising:
a MOS switch having a drain connected to an input terminal and a source connected to an output terminal;
a step-up circuit for supplying electric charges to a gate of the MOS switch;
an electric-charge discharging unit coupled between the gate and a ground terminal; and
a comparator for comparing a voltage of the output terminal with a reference voltage,
wherein the electric-charge discharging unit includes:
a switch coupled between the gate and the ground terminal, and
a clock signal providing unit for providing a clock signal to a control terminal of the switch according to an output signal of the comparator.

2. The power source connection circuit according to claim 1, wherein the clock signal providing unit includes an oscillator circuit being enabled and generating the clock signal according to an output signal of the comparator.

3. The power source connection circuit according to claim 1, wherein the clock signal providing unit provides an internal clock signal of the step-up circuit to the control terminal of the switch according to an output signal of the comparator.

4. A power source connection circuit, comprising:
a MOS switch for receiving an input voltage from a first terminal and outputting an output voltage to a second terminal;
a step-up circuit for supplying electric charges to a gate of the MOS switch; and
an electric-charge discharging unit for forming a current path from the gate to a third terminal when the output voltage is lower than a reference voltage, and interrupting the current path when the output voltage is higher than the reference voltage,
wherein the electric-charge discharging unit includes a switch unit for forming the current path when the output voltage is lower than the reference voltage, and interrupting the current path when the output voltage is higher than the reference voltage,
wherein the electric-charge discharging unit includes a rectifier unit having a threshold voltage which is equal to or lower than a breakdown voltage of a Zener diode and which is equal to or higher than a threshold voltage of the switch unit, and
wherein the switch unit:
connects the rectifier unit between the gate and the third terminal when the output voltage is lower than the reference voltage, and
disconnects the rectifier unit between the gate and the third terminal when the output voltage is higher than the reference voltage.

5. The power source connection circuit according to claim 4, wherein the rectifier unit and the switch unit are coupled to each other in series between the gate and the third terminal.

6. The power source connection circuit according to claim 5, wherein the rectifier unit includes one Zener diode comprising:
a cathode connected to the gate; and
an anode connected to the third terminal.

7. The power source connection circuit according to claim 6, further comprising:
a short-circuit detection unit for outputting a detection signal indicating that the output terminal is short-circuited when the output voltage falls below the reference voltage,
wherein the electric-charge discharging unit discharges electric charges accumulated in the gate of the MOS switch to the third terminal according to the detection signal.

8. The power source connection circuit according to claim 5, wherein the rectifier unit includes one or more diodes coupled in series such that forward directions of the diodes point in the direction from the gate toward the third terminal.

9. The power source connection circuit according to claim 8, further comprising:
a short-circuit detection unit for outputting a detection signal indicating that the output terminal is short-circuited when the output voltage falls below the reference voltage, wherein the electric-charge discharging unit discharges electric charges accumulated in the gate of the MOS switch to the third terminal according to the detection signal.

10. The power source connection circuit according to claim 5, wherein the rectifier unit includes one or more diode-connected MOS transistors coupled in series such that forward directions of the diode-connected MOS transistors point in the direction from the gate toward the third terminal.

11. The power source connection circuit according to claim 10, further comprising:
a short-circuit detection unit for outputting a detection signal indicating that the output terminal is short-circuited when the output voltage falls below the reference voltage,
wherein the electric-charge discharging unit discharges electric charges accumulated in the gate of the MOS switch to the third terminal according to the detection signal.

12. The power source connection circuit according to claim 5, wherein the rectifier unit includes one or more diode-connected bipolar transistors coupled in series such that forward directions of the diode-connected bipolar transistors point in the direction from the gate toward the third terminal.

13. The power source connection circuit according to claim 12, further comprising:
a short-circuit detection unit for outputting a detection signal indicating that the output terminal is short-circuited when the output voltage falls below the reference voltage,
wherein the electric-charge discharging unit discharges electric charges accumulated in the gate of the MOS switch to the third terminal according to the detection signal.

14. The power source connection circuit according to claim 4, further comprising:
a short-circuit detection unit for outputting a detection signal indicating that the output terminal is short-circuited when the output voltage falls below the reference voltage,
wherein the electric-charge discharging unit discharges electric charges accumulated in the gate of the MOS switch to the third terminal according to the detection signal.

15. The power source connection circuit according to claim 14, wherein the short-circuit detection unit comprises a comparator for comparing the output voltage with the reference voltage and outputting the detection signal.

16. The power source connection circuit according to claim 5, further comprising:
a short-circuit detection unit for outputting a detection signal indicating that the output terminal is short-circuited when the output voltage falls below the reference voltage,
wherein the electric-charge discharging unit discharges electric charges accumulated in the gate of the MOS switch to the third terminal according to the detection signal.

17. A power source connection circuit, comprising:
a MOS switch for receiving an input voltage from a first terminal and outputting an output voltage to a second terminal;
a step-up circuit for supplying electric charges to a gate of the MOS switch; and
an electric-charge discharging unit for forming a current path from the gate to a third terminal when the output voltage is lower than a reference voltage, and interrupting the current path when the output voltage is higher than the reference voltage,
wherein the electric-charge discharging unit includes a switch unit for forming the current path when the output voltage is lower than the reference voltage, and interrupting the current path when the output voltage is higher than the reference voltage, and
wherein the electric-charge discharging unit includes a clock signal providing unit for:
providing a clock signal to a control terminal of the switch unit when the output voltage is lower than the reference voltage, and
stopping providing the clock signal when the output voltage is higher than the reference voltage.

18. The power source connection circuit according to claim 17, wherein the clock signal providing unit includes an oscillator circuit for:
generating the clock signal when the output voltage is lower than the reference voltage; and
stopping the generation of the clock signal when the output voltage is higher than the reference voltage.

19. The power source connection circuit according to claim 17, wherein the clock signal providing unit:
provides an internal clock signal of the step-up circuit to the control terminal of the switch unit when the output voltage is lower than the reference voltage; and
stops providing the internal clock signal of the step-up circuit when the output voltage is higher than the reference voltage.

20. The power source connection circuit according to claim 17, further comprising:
a short-circuit detection unit for outputting a detection signal indicating that the output terminal is short-circuited when the output voltage falls below the reference voltage,
wherein the electric-charge discharging unit discharges electric charges accumulated in the gate of the MOS switch to the third terminal according to the detection signal.

21. The power source connection circuit according to claim 18, further comprising:
a short-circuit detection unit for outputting a detection signal indicating that the output terminal is short-circuited when the output voltage falls below the reference voltage,
wherein the electric-charge discharging unit discharges electric charges accumulated in the gate of the MOS switch to the third terminal according to the detection signal.

22. The power source connection circuit according to claim 19, further comprising:
a short-circuit detection unit for outputting a detection signal indicating that the output terminal is short-circuited when the output voltage falls below the reference voltage,
wherein the electric-charge discharging unit discharges electric charges accumulated in the gate of the MOS switch to the third terminal according to the detection signal.

* * * * *